United States Patent [19]

Miki et al.

[11] Patent Number: 4,958,157
[45] Date of Patent: Sep. 18, 1990

[54] ENCODER CIRCUIT WITH SERIES CONNECTED OUTPUT SWITCHING TRANSISTORS

[75] Inventors: Takahiro Miki; Shiro Hosotani, both of Hyogo, Japan

[73] Assignee: Mitsubishi Denki Kabushiki Kaisha, Tokyo, Japan

[21] Appl. No.: 310,112

[22] Filed: Feb. 14, 1989

[30] Foreign Application Priority Data

Feb. 15, 1988 [JP] Japan ................................. 63-33232

[51] Int. Cl.$^5$ ............................................. H03M 1/00
[52] U.S. Cl. ...................................... 341/133; 341/50; 341/159
[58] Field of Search ...................... 341/133, 50, 96, 97, 341/112, 155, 159

[56] References Cited

U.S. PATENT DOCUMENTS

| | | | |
|---|---|---|---|
| 4,507,649 | 3/1985 | Dingwall et al. | 341/133 |
| 4,591,825 | 5/1986 | Bucklen | 341/96 |
| 4,600,916 | 7/1986 | Masuda et al. | 341/159 |
| 4,644,322 | 2/1987 | Fujita | 341/159 |
| 4,694,278 | 9/1987 | Fuchs et al. | 341/50 |
| 4,752,766 | 6/1988 | Shimizu et al. | 341/159 |
| 4,764,749 | 8/1988 | Machida | 341/50 |

OTHER PUBLICATIONS

A. Dingwall, "Monolithic Expandable 6 Bit, 20 MHz CMOS/SOS A/d Converter", IEEE Journal of Solid-State Circuits, vol. SC-14, No. 6, Dec. 1979.

*Primary Examiner*—William M. Shoop, Jr.
*Assistant Examiner*—Helen Kim
*Attorney, Agent, or Firm*—Lowe, Price, Leblanc, Becker & Shur

[57] ABSTRACT

An encoder circuit is disclosed wherein a plurality of input signals are parallel-supplied directly to the gates of transistor pairs. Each transistor pair comprises at least two series-connected transistors which are provided between an associated one of output lines and a source of a predetermined potential level (a supply potential or groud potential). The encoding function of the circuit is performed by turning on and off the transistors.

3 Claims, 3 Drawing Sheets

ENCODER CIRCUIT WITH SERIES CONNECTED OUTPUT SWITCHING TRANSISTORS

BACKGROUND OF THE INVENTION

1. Field of the Invention

This invention relates generally to an encoder circuit, and in particular to an encoder circuit for encoding a plurality of parallel input signals into encoded data in a predetermined form to be fed out on a plurality of output lines, by ascertaining the critical level at which the input signals change from a high level to a low level and vice versa.

2. Description of the Background Art

In order to have a background understanding of the invention, reference is made to FIG. 3 which illustrates the configuration of a typical prior-art encoder circuit. The illustrated circuit functions to find out the critical level at which input signals $D_1$–$D_2$ change from a high or "H" level to a low or "L" level, and convert them into binary-coded output signals, which are fed out on output lines $L_1$–$L_3$. The input signals $D_1$–$D_7$ are of such nature that, if some input signals $D_i$ (where $i=1$–7) are at the "H" level, other signals $D_j$ (where $i>j$) are all at the "H" level, and that if input signals $D_i$ are at "L" level, then other input signals $D_k$ (where $i<k$) are all at the "L" level. It is noted that these relations are valid when the high and low level conditions are reversed with each other. The encoder circuit of FIG. 3 performs the desired encoding function by finding the critical level at which the input signals turn from the "H" level to the low level or vice versa. Among the circuit devices which generates signals of the nature similar to the input signals $D_1$–$D_7$ is a comparator assembly in the flash A/D converter.

As shown in FIG. 3, if the source potential at one input of the NAND gate $A_7$ is set as an inverted input signal $\overline{D_8}$, and the source potential at the other input of the NAND gate $A_0$ is set as an input signal $D_0$, an input signal $D_i$ and an inverted input signal $\overline{D_{i+1}}$ are supplied to NAND gates $A_i$ (where $i=0$–7) among the NAND gates $A_0$–$A_7$. In other words, each of the NAND gates $A_0$–$A_7$ is supplied with a non-inverted input signal in the series of input signals $D_0$–$D_8$ and an inverted signal of an input signal succeeding to the non-inverted input signal.

The output signals of the NAND gate $A_i$ (where $i=0$–7) is supplied out in conformity with 3-bit binary data as follows.

(1) When an "1" level output is to be supplied on each output line $L_j$ ($j=1$–3), the output of the NAND gate $A_i$ is fed out to the gate of a p-channel MOS transistor whose source is connected to the source potential and whose drain is coupled to the output line $L_j$.

(2) when an "0" level output is to be supplied on each output line $L_j$, the output of the NAND gate $A_i$ is fed out via an inverter $I_i$ to the gate of an n-channel MOS transistor whose source is coupled to ground potential and whose drain is connected to the output line $L_j$.

In this manner, for example, when only the output of the NAND gate $A_4$ is at "L" level, the "100" signal is supplied out on the output lines L3, L2 and L1. Thus, the output from the NAND gate $A_4$ is applied to the gate of a p-channel MOS transistor whose source is coupled to the supply voltage and whose drain is connected to the output line L3. The output from the NAND gate $A_4$ is also applied via the inverter $I_4$ to the gate of an n-channel MOS transistor whose source is coupled to ground potential and whose drain is linked to the output line L2 (or L1).

With this arrangement, regarding the outputs from the NAND gates $A_0$–$A_7$ as intermediate signals, the relations among the input signals, intermediates signals and output signals are expressed as in the Table 1.

TABLE 1

| Input | | | | | | | | | Intermediate Signal | | | | | | | | Output | | |
|---|---|---|---|---|---|---|---|---|---|---|---|---|---|---|---|---|---|---|---|
| ($D_0$) | $D_1$ | $D_2$ | $D_3$ | $D_4$ | $D_5$ | $D_6$ | $D_7$ | ($D_8$) | $A_0$ | $A_1$ | $A_2$ | $A_3$ | $A_4$ | $A_5$ | $A_6$ | $A_7$ | $B_3$ | $B_2$ | $B_1$ |
| 1 | 0 | 0 | 0 | 0 | 0 | 0 | 0 | 0 | 0 | 1 | 1 | 1 | 1 | 1 | 1 | 1 | 0 | 0 | 0 |
| 1 | 1 | 0 | 0 | 0 | 0 | 0 | 0 | 0 | 0 | 1 | 1 | 1 | 1 | 1 | 1 | 1 | 0 | 0 | 1 |
| 1 | 1 | 1 | 0 | 0 | 0 | 0 | 0 | 0 | 1 | 1 | 0 | 1 | 1 | 1 | 1 | 1 | 0 | 1 | 0 |
| 1 | 1 | 1 | 1 | 0 | 0 | 0 | 0 | 0 | 1 | 1 | 1 | 0 | 1 | 1 | 1 | 1 | 0 | 1 | 1 |
| 1 | 1 | 1 | 1 | 1 | 0 | 0 | 0 | 0 | 1 | 1 | 1 | 1 | 0 | 1 | 1 | 1 | 1 | 0 | 0 |
| 1 | 1 | 1 | 1 | 1 | 1 | 0 | 0 | 0 | 1 | 1 | 1 | 1 | 1 | 0 | 1 | 1 | 1 | 0 | 1 |
| 1 | 1 | 1 | 1 | 1 | 1 | 1 | 0 | 0 | 1 | 1 | 1 | 1 | 1 | 1 | 0 | 1 | 1 | 1 | 0 |
| 1 | 1 | 1 | 1 | 1 | 1 | 1 | 1 | 1 | 1 | 1 | 1 | 1 | 1 | 1 | 1 | 0 | 1 | 1 | 1 |

For example, if the input signals $D_0$–$D_8$ are coded [111110000], then, as represented in the Table 1, only the output of the NAND gate $A_4$ takes on the "L" level (or "0"), and the outputs from the remaining NAND gates $A_0$–$A_3$ and $A_5$–$A_7$ all assume the "H" level (or "1").

Consequently, the p-channel MOS transistor which is supplied with the output from the NAND gates $A_4$ at its gate as well as the n-channel MOS transistor which is supplied with the output of the same NAND gate $A_4$ at its gate through the inverter $I_4$ is turned on, rendering the output line L3 at the "H" level and the output lines L2 and L1 at the "L" level. Under the conditions, the binary data coded "100" are obtained on the output lines L3–L1 as shown in the Table 1.

For purpose of simplicity and clarity, a 7-segmented (3-bit) encode circuit is illustrated in FIG. 3. However, the actual design of the circuit involves a higher degree or level of segmentation.

With the conventional arrangement of the encoded circuit, it is necessary to provide N+1 NAND gates and inverters for N pairs of input signals (in the form of inverted and non-inverted signals). In short, additional NAND gates and inverters are required for the proper encoding function, which results in larger power consumption. Also, the NAND gates and inverters incorporated in the encoder circuit tend to delay the signal transfer, retarding the encoding operation of the circuit.

SUMMARY OF THE INVENTION

Therefore, it is an object of the invention to provide an encoder circuit capable of operating at higher speeds at lower power consumption.

Briefly stated, the encoder circuit of the invention includes a plurality of transistor pairs, each comprising first and second transistors coupled between an output line and a source of a predetermined potential level. The first transistor is supplied at its gate with an inverted value of a given one of a series of input signals, while the second transistor is applied at its gate with a non-inverted value of the input signal next to the given input signal.

According to the invention, the desired encoding function of the encoder circuit is achieved through the turning on and off of the transistor pairs by applying the input signal and its inverted signal directly to respective transistor pairs. This mode of circuit operation effectively eliminates the necessity of NAND gates and inverters, which in turn leads to a high speed encoding function at lower power consumption.

The foregoing and other objects, features, aspects and advantages of the present invention will become more apparent from the following detailed description of the present invention when taken in conjunction with the accompanying drawings.

BRIEF DESCRIPTION OF THE DRAWINGS

Referring to FIG. 1, there is illustrated an encoder circuit according to one preferred embodiment of the invention. The encoder circuit receives a series of input signals $D_0-D_8$ and another series of inverted input signals $\overline{D_1}-\overline{D_7}$. The input signals $D_1-D_7$ are generated, for example, by a group of comparators incorporated in a flash A/D converter, and they are of the same operating nature as that of the input signals $D_1-D_7$ previously discussed in connection to FIG. 3. The input signal $D_0$ is fixedly set at the source potential (or the H" level), while the input signal at ground potential (or the "L" level).

Figure 1:
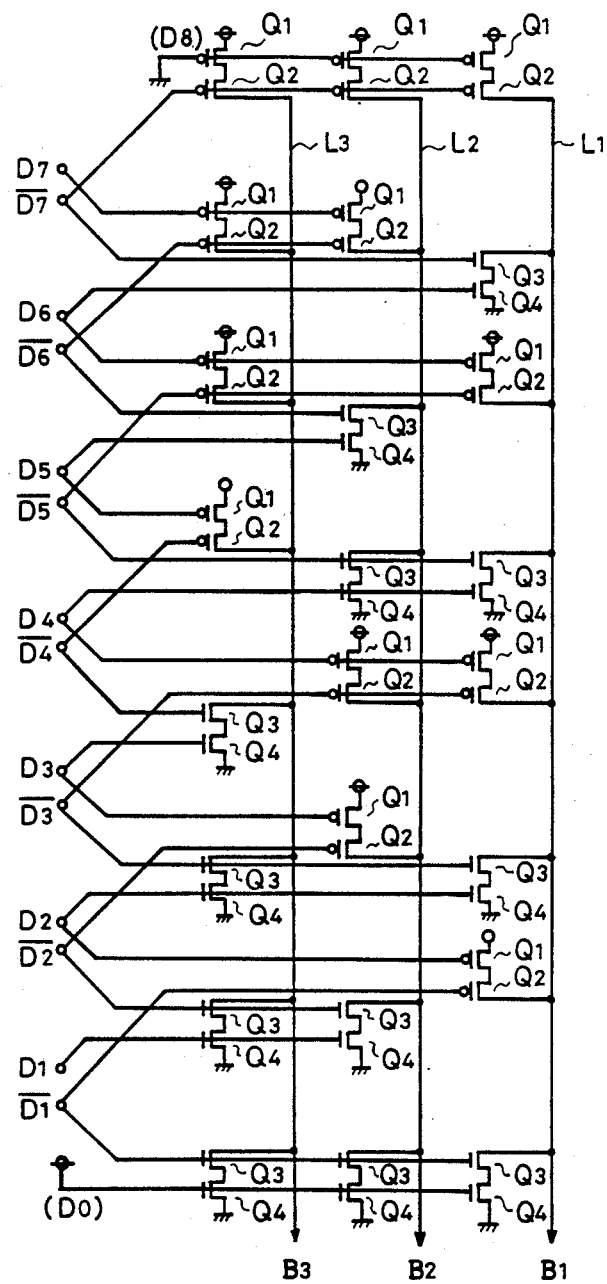
FIG. 1 is a circuit diagram of an encoder circuit according to one preferred embodiment of the invention.

A plurality of transistor pairs of series-connected pMOS transistors Q1 and Q2, and a plurality of transistor pairs of series-connected nMOS transistors Q3 and Q4 are coupled to output lines L1, L2 and L3. The pMOS transistor Q1 is supplied at its gate with an input signal $D_{i+1}$ (where i=1-7), and the pMOS transistor Q2 is supplied at its gate with an inverted input signal $\overline{D_i}$. When conducting, the pMOS transistors provide the source potential to the associated output lines. On the other hand, the nMOS transistor Q3 is supplied at its gate with an inverted input signal $\overline{D_{i+1}}$ (where i=0-6), whereas the nMOS transistor Q4 is supplied with an input signal $D_i$. When conducting, the nMOS transistors couple the associated output lines to ground potential.

Connections of the pMOS transistor pairs Q1 and Q2 and the nMOS transistor pairs Q3 and Q4 with respect to the output lines L1, L2 and L3, and with respect to the inverted and non-inverted input signals are determined based on the following rules.

If the number of "1s∞ (or "H" level) in the input signals $D_0-D_7$ is represented by 3-bit binary code, the transistor pairs are arranged with respect to the output lines L1-L3 so that the binary code appears on the output lines L1-L3. For example, if the signal value "1" is to be supplied on an output line Lj (where j=1-3), only the pMOS transistor Q1 and Q2 provided on the output line are turned on to connect the output line Lj to the source potential. When the value "0" should be supplied on the output line Lj, the nMOS transistors Q3 and Q4 provided on that line are turned on to couple the output line Lj to ground potential.

With the arrangement, for example, if the input signals $D_1-D_7$ are represented in binary pattern [1, 1, 1, 1, 0, 0, 0], only the series-connected pMOS transistors Q1 and Q2 which are supplied at their gates the input signals $D_5$ (the "L" level) and the inverted input signal $\overline{D_4}$ (the "L" level) are turned on to bring the output line L3 to the "L" level. While on the other hand, the series-connected nMOS transistors Q3 and Q4 which are supplied at their gates with the "H" level input signal $D_4$ and the "H" level inverted input signal $\overline{D_5}$ are turned to bring the output lines L1 and L2 to ground potential. As a result, the binary-coded 3-bit data (100) is obtained on the output lines L3-L1.

It is apparent that the binary coded output signals $B_3-B_1$ are obtained for the input signals $D_1-D_7$ as represented in that Table 1 without the use of NAND gates $A_0-A_7$ and inverters $I_0-I_6$ as in the prior-art. The illumination of the NAND gates and inverters effectively reduces power consumption. Moreover, the input signals $D_0-D_8$ and the inverted input signals $\overline{D_1}-\overline{D_7}$ are directly applied to the gates of transistors $Q_1-Q_4$ without going through the NAND gates and inverters, which eliminates the transfer delay of the signals in the gates of the transistors and realizes high speed circuit operation.

In the embodiment, the CMOS type encoder circuit is described. However, the present invention may be embodied in a pseudo nMOS type encoder circuit as shown in FIG. 2 where only n-channel transistors are used for encoding transistors.

Figure 2:
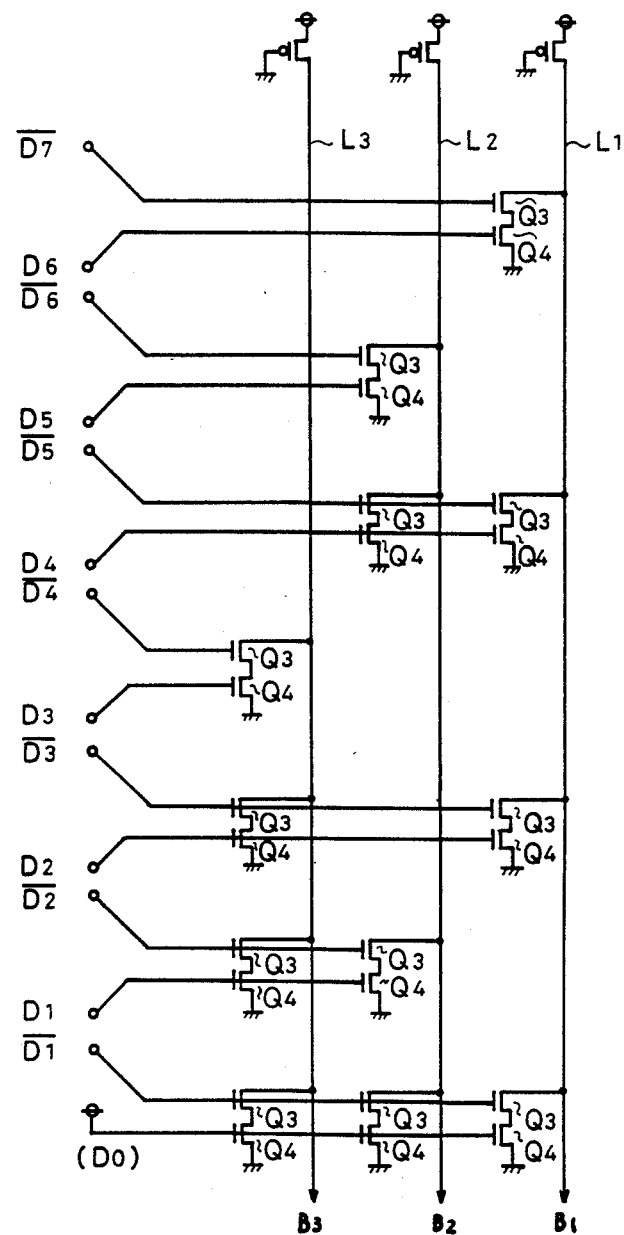
FIG. 2 is a circuit diagram of an encoder circuit according to another preferred embodiment of the invention.
Figure 3:
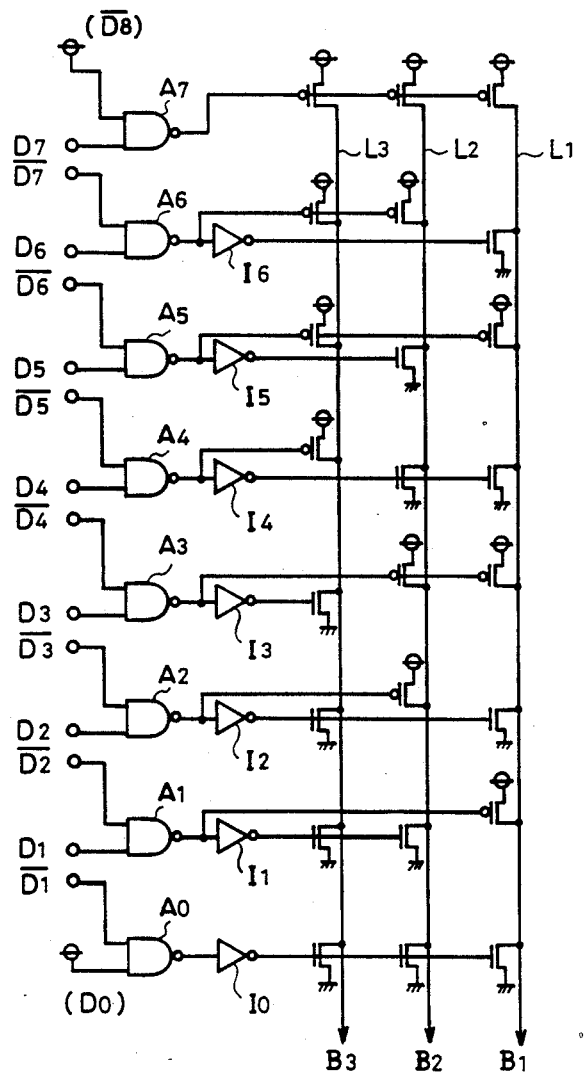
FIG. 3 is a circuit diagram of a prior-art encoder circuit.

In the embodiment of FIG. 2, pMOS transistors whose gates are grounded are provided between the source potential and the output lines L1-L3, respectively. When the "0" data signal should be supplied on the output line Lj, the output line is grounded through the conduction of the nMOS transistors Q3 and Q4 by the input signals $D_0-D_6$ (inverted input signals $\overline{D_1}-\overline{D_7}$). As compared with the conventional nMOS type encoder circuit, the encoder circuit of FIG. 2 is capable of operating at high speed with lower power consumption.

While a pair of transistors Q1 and Q2 or Q3 and Q4 are shown coupled in series with each other, three or more transistors may be series connected. When 3-series transistor connection is used, the gate of the pMOS transistor is supplied with an input signal $D_{i+1}$ and inverted input signals $\overline{D_i}$, $\overline{D_{i-1}}$, while the gate of the nMOS transistor is supplied with an inverted input signal $\overline{D_{i+1}}$, input signals $D_i$ and $D_{i-1}$.

In the illustrated embodiments, MOS transistors are used but other devices which are capable of ON-OFF operation with respect to the "H" and "L" levels of the input signals such as bi-polar transistors and junction FET may also be used to advantage.

Also, in the illustrated embodiments, the input signals are encoded into binary code signals. The input signals may also be converted into gray code signals.

Although the present invention has been described and illustrated in detail, it is clearly understood that the same is by way of illustration and example only and is not to be taken by way of limitation; the spirit and scope of the present invention being limited only by the terms of the appended claims.

What is claimed is:

1. An encoder circuit for converting a plurality of parallel-supplied input signals into encoded data in the form of a predetermined output signal by sensing a critical level at which the input signal changes between its high and low levels, and supplying the encoded output signal on a plurality of output lines, said encoder circuit comprising:
  a plurality of transistor pairs provided between each of said output lines and a source of a predetermined potential level,
  each of said transistor pairs comprising
    a first transistor which is supplied with an inverted value of one of the two successive input signals in said parallel-supplied input signals; and
    a second transistor having the same conductivity type as said first transistor which is connected in series with said first transistor and is supplied with a non-inverted value of the other of said two successive input signals in said parallel-supplied input signals.

2. An encoder circuit according to claim 1, wherein said plurality of transistor pairs are coupled to said output lines so that binary coded-data of said input signals are supplied on said output lines.

3. An encoder circuit for providing a binary output signal in response to a plurality of input signals, said encoder circuit comprising:
  a plurality of n ordered signal input terminals for receiving respective ones of said input signals;
  a plurality of m ordered output signal lines for supplying said binary output signal wherein $m \geq \log_2(n)$;
  a plurality of transistor pairs provided between each of said output signal lines and a source of a predetermined potential level, each of said transistor pairs including a first transistor supplied with an inverted value of one of two successive input signals of said input signals from successive ones of said input terminals and a second transistor connected in series with said first transistor and having the same conductivity type as said first transistor, said second transistor supplied with a non-inverted value of the other of said two successive input signals.

* * * * *